United States Patent
Elrayyah et al.

(10) Patent No.: US 10,147,825 B2
(45) Date of Patent: Dec. 4, 2018

(54) HYBRID PARTIAL POWER PROCESSING SYSTEM

(71) Applicant: QATAR FOUNDATION FOR EDUCATION, SCIENCE AND COMMUNITY DEVELOPMENT, Doha (QA)

(72) Inventors: Ali Yaseen Elrayyah, Doha (QA); Abdelkader Bousselham, Doha (QA)

(73) Assignee: Qatar Foundation, Doha (QA)

( * ) Notice: Subject to any disclaimer, the term of this patent is extended or adjusted under 35 U.S.C. 154(b) by 147 days.

(21) Appl. No.: 15/361,346

(22) Filed: Nov. 25, 2016

(65) Prior Publication Data
US 2017/0149249 A1 May 25, 2017

Related U.S. Application Data

(60) Provisional application No. 62/260,209, filed on Nov. 25, 2015.

(51) Int. Cl.
| | |
|---|---|
| H02J 1/00 | (2006.01) |
| H02J 3/00 | (2006.01) |
| H01L 31/02 | (2006.01) |
| G05F 1/67 | (2006.01) |

(52) U.S. Cl.
CPC .......... *H01L 31/02021* (2013.01); *G05F 1/67* (2013.01); *Y02E 10/58* (2013.01)

(58) Field of Classification Search
CPC .. H02J 3/385; H02J 3/46; H02S 40/36; H01L 31/02021; Y02E 10/58; G05F 1/67

USPC .......................................................... 307/77
See application file for complete search history.

(56) References Cited

U.S. PATENT DOCUMENTS

| | | |
|---|---|---|
| 8,330,299 B2 | 12/2012 | Steigerwald et al. |
| 2012/0161527 A1 | 6/2012 | Casey et al. |
| 2014/0042815 A1 | 2/2014 | Maksimovic et al. |
| 2014/0049998 A1 | 2/2014 | Casey et al. |

(Continued)

OTHER PUBLICATIONS

Author: Agamy et al.; Title: An Efficient Partial Power Processing DC/DC Converter for Distributed PV Architectures; Date: Feb. 2014; Publisher: IEEE transactions on power electronics; vol. 29, No. 2; Pertinent pp.: 674-686.*

(Continued)

*Primary Examiner* — Richard Tan
(74) *Attorney, Agent, or Firm* — Richard C. Litman

(57) ABSTRACT

The hybrid partial power processing system includes differential power processing converters DPPs having low power ratings, which are used to exchange differential power between two adjacent PV modules, or between PV modules and a line capacitor ($C_{lin}$) connected in series within the same string. The exchange of differential power by DPPs is needed to track the maximum power point of each PV module in the string. The DC power optimizing converter (DC-PO) is a DC/DC power converter used to feed current (power) from a PV module to $C_{lin}$. The DC-PO is driven to track the maximum power point (MPP) of one PV module, and the MPP of each one of the remaining PV modules in the string is tracked by a DPP.

8 Claims, 10 Drawing Sheets

(56) References Cited

U.S. PATENT DOCUMENTS

2016/0079761 A1    3/2016   Pilawa-Podgurski et al.

OTHER PUBLICATIONS

Shibin Qin et al., "A Distributed Approach to MPPT for PV Sub-Module Differential Power Processing", IEEE Transactions on Power Electronics, vol. 30, Iss. 4 (Apr. 2015).

* cited by examiner

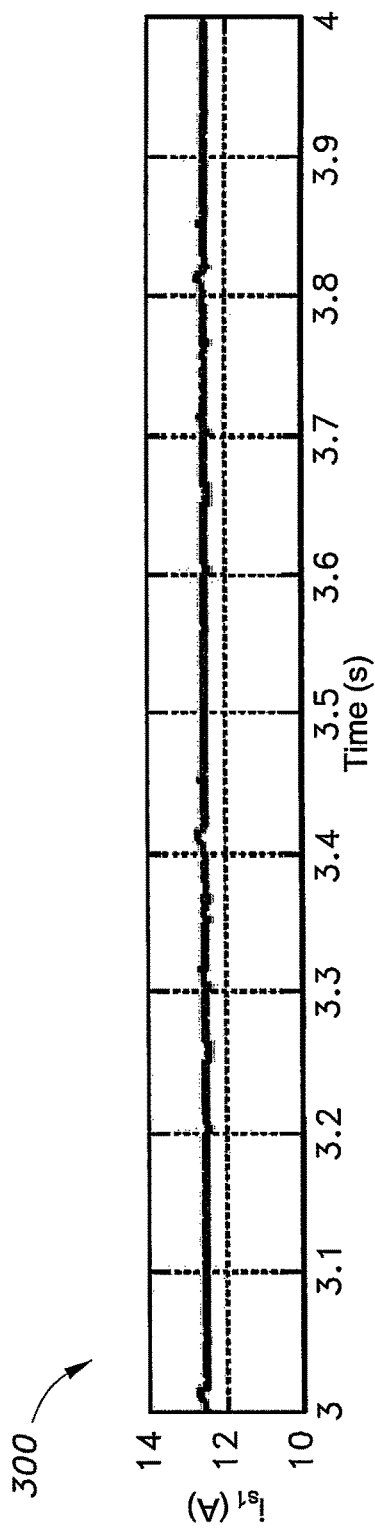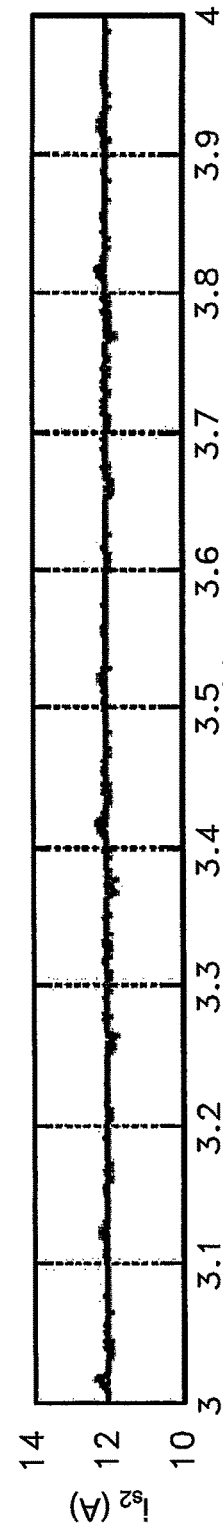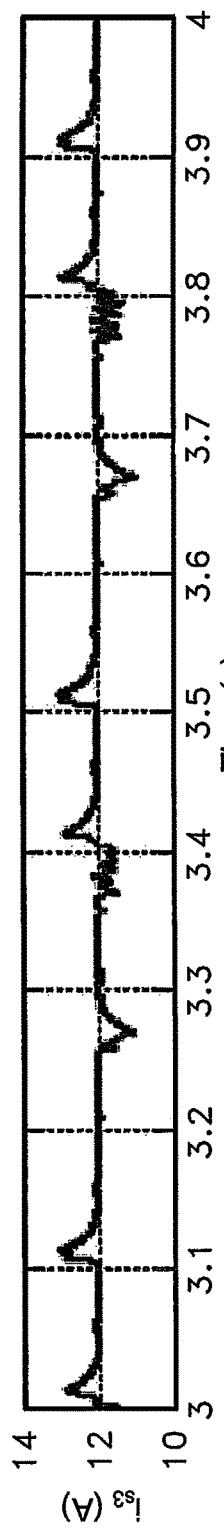
Fig. 3A
Fig. 3B
Fig. 3C

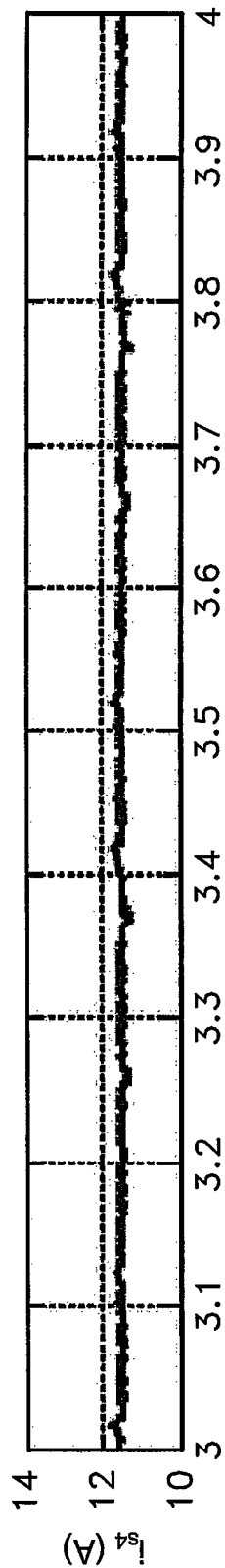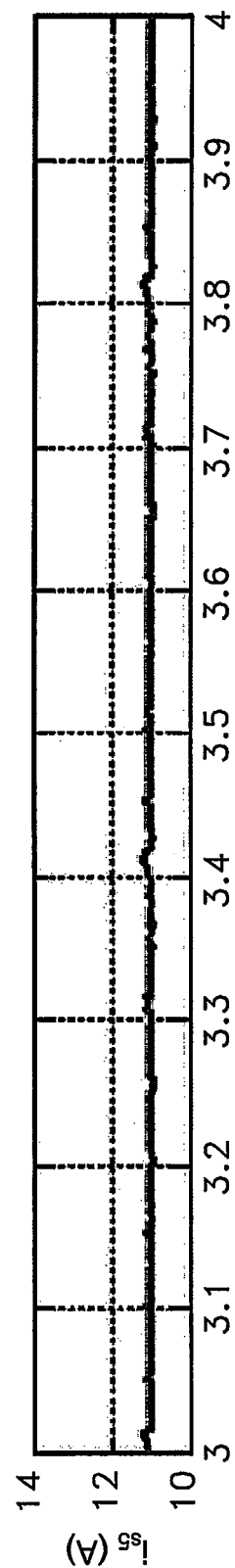
Fig. 3D
Fig. 3E

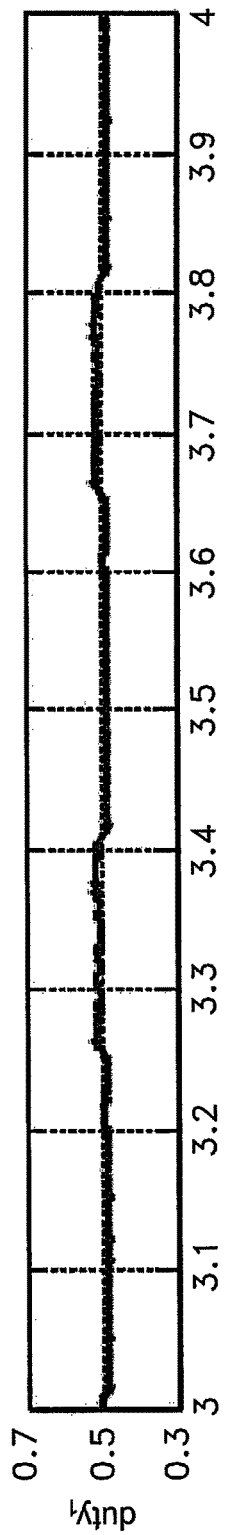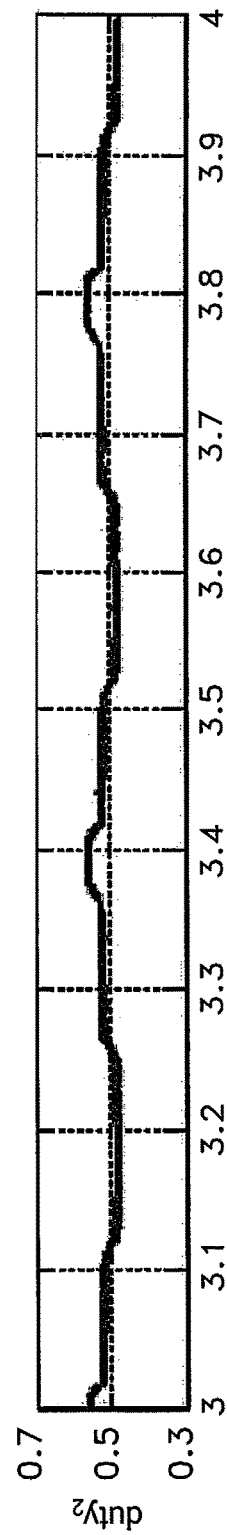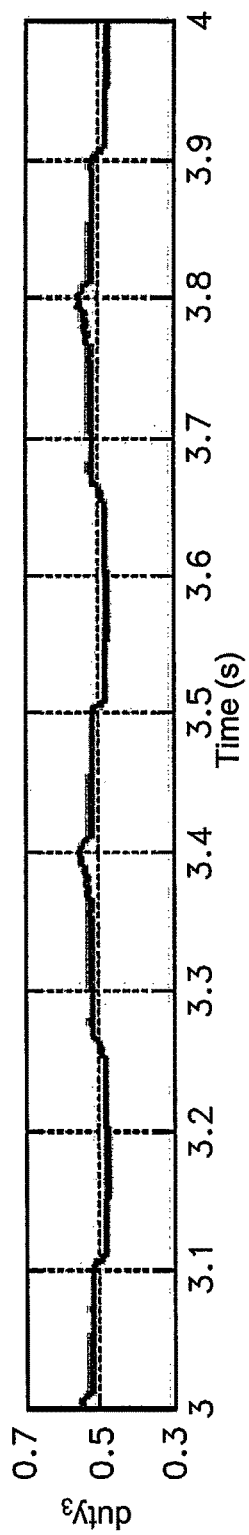

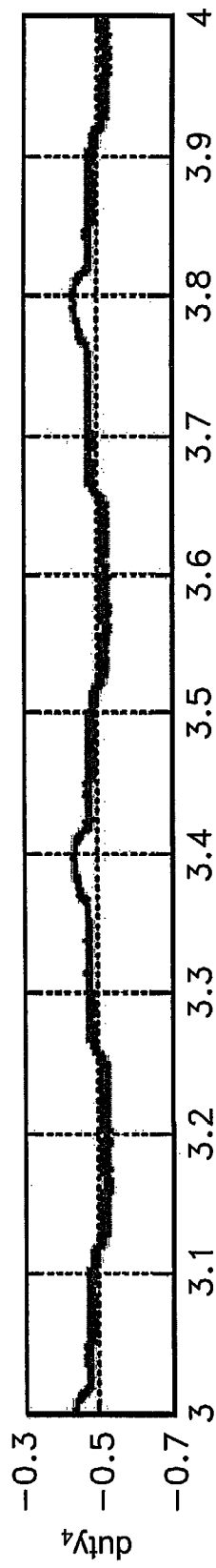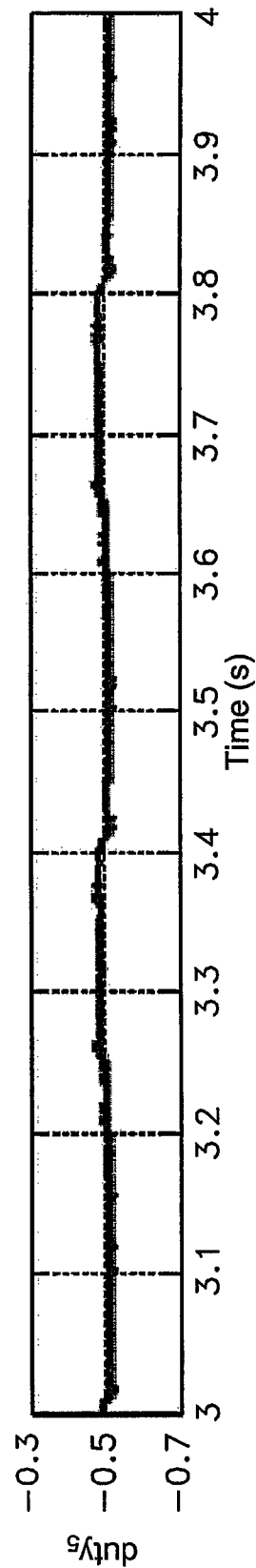
Fig. 4D
Fig. 4E

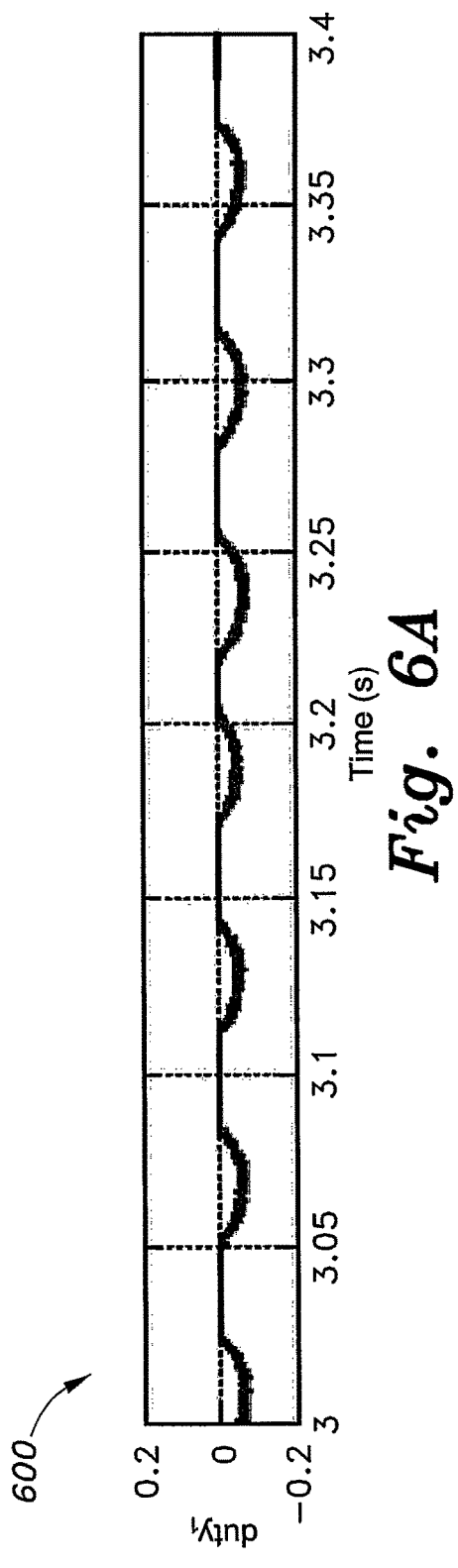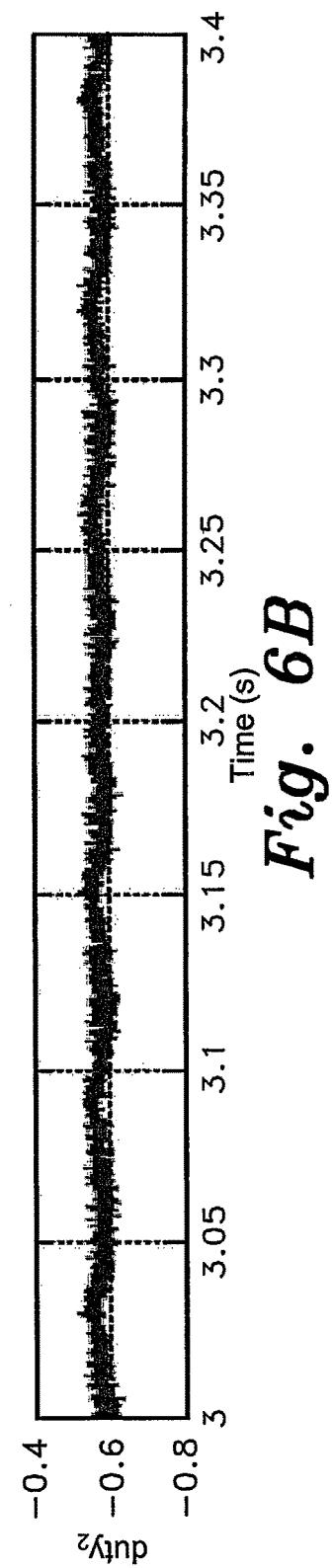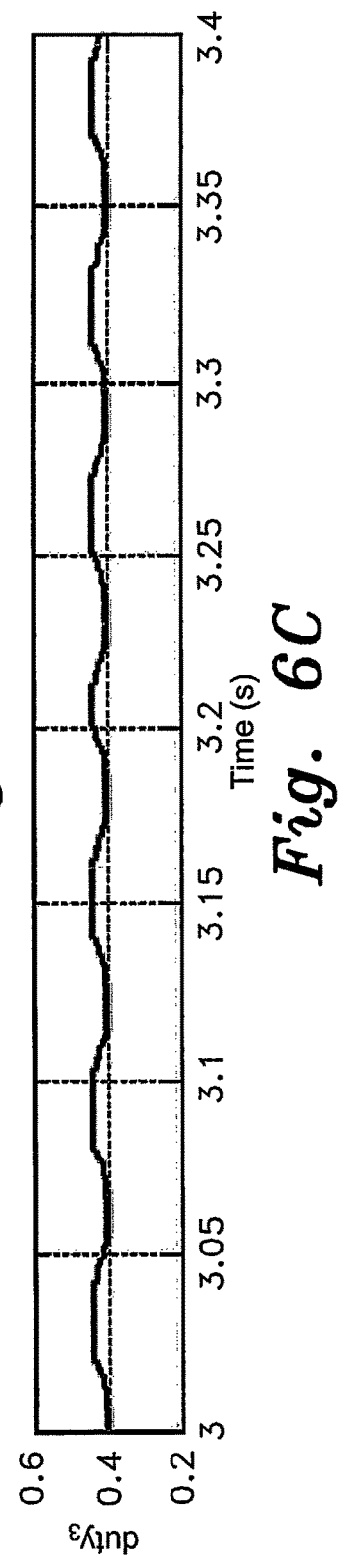

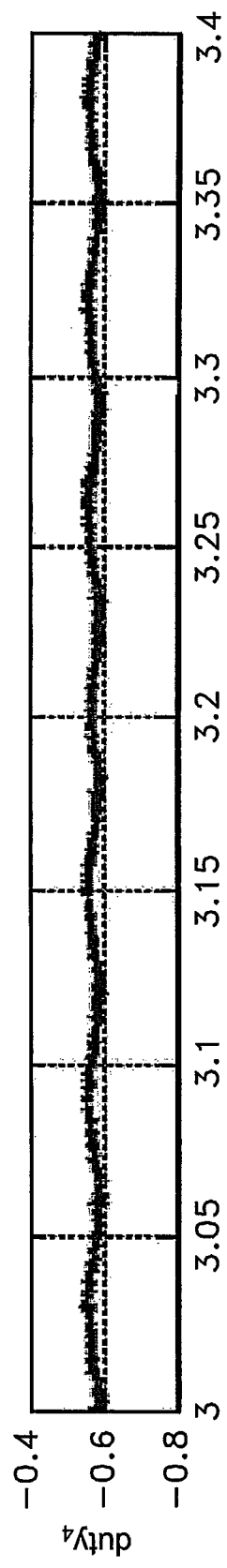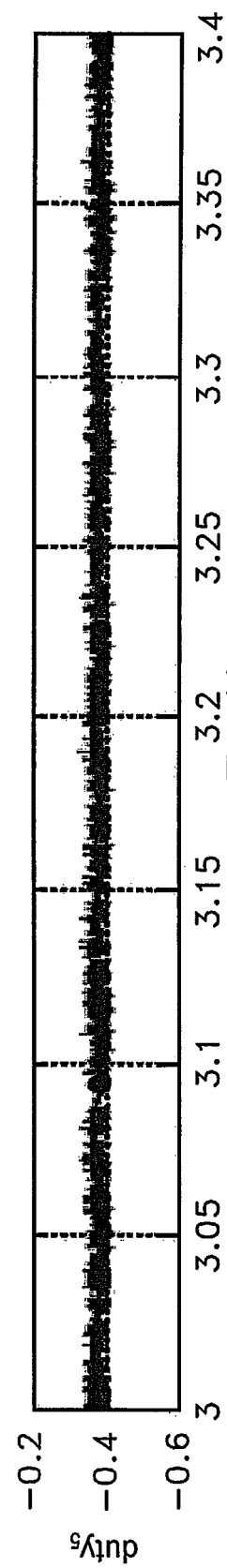
Fig. 6D
Fig. 6E

US 10,147,825 B2

HYBRID PARTIAL POWER PROCESSING SYSTEM

CROSS-REFERENCE TO RELATED APPLICATION

This application claims the benefit of U.S. Provisional Patent Application Ser. No. 62/260,209, filed Nov. 25, 2015.

BACKGROUND OF THE INVENTION

1. Field of the Invention

The present invention relates to renewable energy interfacing with power systems, and particularly to a hybrid partial power processing (PPP) system of serially connected photovoltaic (PV) modules in a string. In the presented PPP, currents are supplied to a capacitor connected in the string through one DC power optimizer (DC-PO) and several differential power processing DC/DC converters (DPP) to ensure maximum power point tracking of each one of the PV modules is properly tracked.

2. Description of the Related Art

Common practices to interface PV modules to utility grids are based on using central and string inverters. In these technologies, the same current passes over a number of serially connected PV modules. Unfortunately, this behavior may not allow the maximum power point (MPP) of each module to be tracked. Different factors, such as manufacturing variability, aging, shading, differences in orientation, and accumulation of dirt/dust, may cause mismatches in the MPP characteristics of serially connected PV modules. Thus, the required electric current to operate one module at its MPP could be different from the current required by other modules connected at the same string. Accordingly, the current that passes over every module needs to be controlled independently to ensure MPP operation of all PV modules. Previous attempts to accomplish this require costly components due to high voltage or current ratings, or complicated control algorithms to coordinate the modules.

Thus, a hybrid partial power processing system solving the aforementioned problems is desired.

SUMMARY OF THE INVENTION

The hybrid partial power processing system includes differential power processing converters DPPs having low power ratings, which are used to exchange differential power between two adjacent PV modules, or between PV modules and a line capacitor ($C_{lin}$) connected in series within the same string. The exchange of differential power by DPPs is needed to track the maximum power point of each PV module in the string. DPPs are considered to support bidirectional power flow, but unidirectional power flow operation could also be supported. The DC power optimizing converter (DC-PO) is a DC/DC power converter used to feed current (power) from a PV module to $C_{lin}$. DC-PO is driven to track the maximum power point (MPP) of one PV module, and the MPP of each one of the remaining PV modules in the string is tracked by a DPP. DC-PO supplies $C_{lin}$ with most of the current required to match the string current, while DPPs supply $C_{lin}$ with small current that corresponds to the difference in MPP power among the PV modules in the same string. This feature allows low power and low cost differential power processing converters to be used with distributed, modular and simple control systems.

These and other features of the present invention will become readily apparent upon further review of the following specification and drawings.

BRIEF DESCRIPTION OF THE DRAWINGS

FIGS. 3A, 3B, 3C, 3D, and 3E are plots showing the output currents of first through fifth PV modules, respectively, in a simulation of a hybrid partial power processing system according to the present invention using a buck-boost type DC power optimizer (DC-PO).

FIGS. 4A, 4B, 4C, 4D, and 4E are plots showing the duty cycles for the differential power processing converters (DPPs) and DC-PO used in the buck-boost simulation of FIGS. 3A-3E.

FIGS. 6A, 6B, 6C, 6D, and 6E are plots showing the duty cycles for the differential power processing converters (DPPs) and DC-PO used in the buck simulation of FIGS. 5A-5E.

Similar reference characters denote corresponding features consistently throughout the attached drawings.

DETAILED DESCRIPTION OF THE PREFERRED EMBODIMENTS

Figure 1:
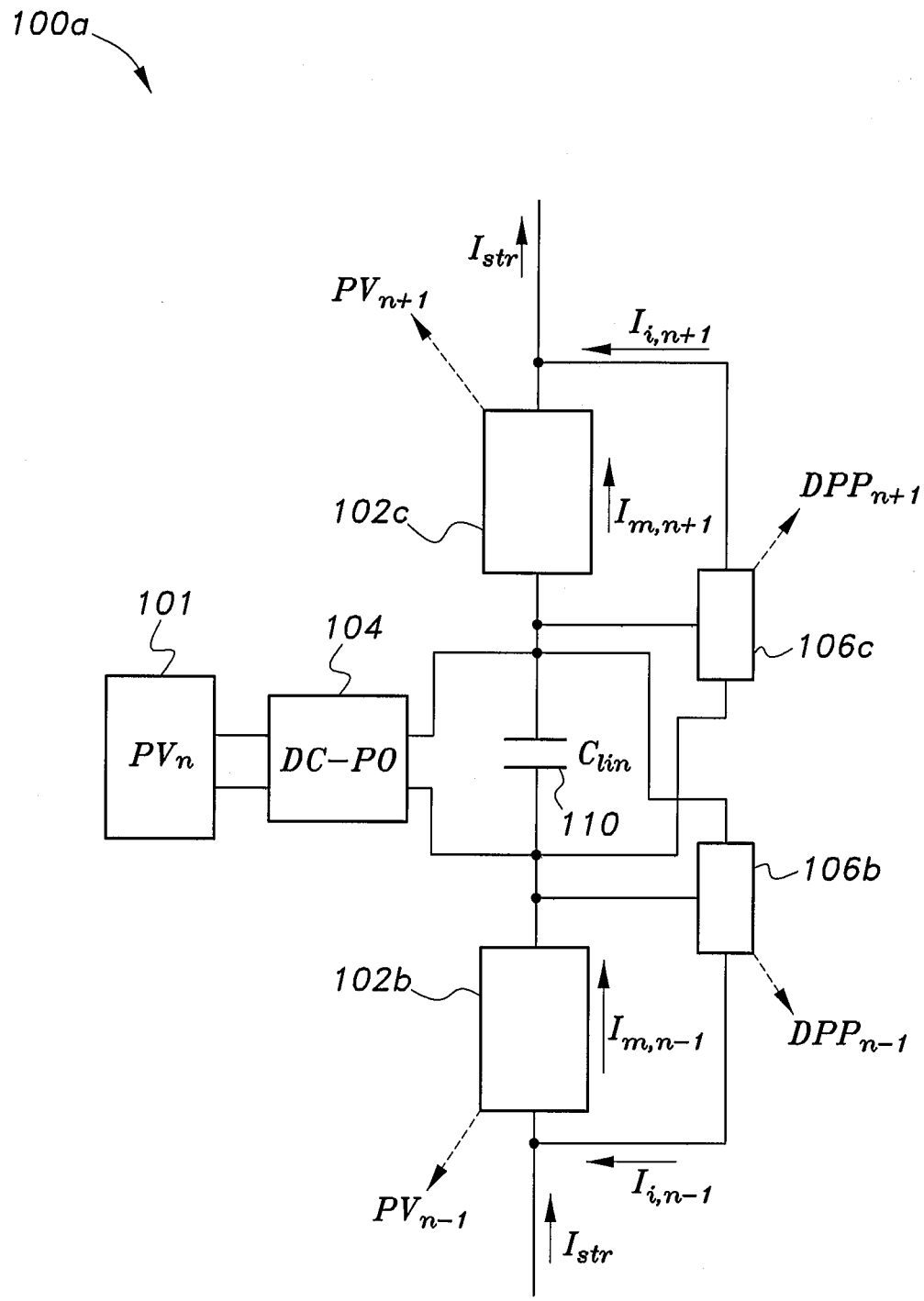
FIG. 1 is a schematic diagram showing an exemplary hybridization of a PPP technique for processing partial power in a hybrid partial power processing system according to the present invention.

As shown in FIG. 1, the hybrid partial power processing system (PPP hybridization 100a) includes differential power processing converter 106b ($DPP_{n-1}$) and differential power processing converter 106c ($DPP_{n+1}$) where both of them have low rated power. The converters 106b and 106c are used to exchange the differential power of the PV module 102b ($PV_{n-1}$) and module 102c ($PV_{n+1}$), respectively, with the line capacitor 110 ($C_{lin}$). In one embodiment, the differential power processing converters 106b and 106c could be of bidirectional type where the power can flow in both directions. In other embodiments, the differential power processing converters 106b and 106c could be of unidirectional type, either feeding power to the line capacitor 110 ($C_{lin}$) or extracting power from it. The DC power optimizing converter 104 (DC-PO) is a DC/DC converter used to feed current (power) from the PV module 101 ($PV_{n-1}$) to the line capacitor 110 ($C_{lin}$). At least one power exchanging DC-DC converter may be connected in parallel with the DC-PO 104. Differential power processing converter 106b has one of its input/output ports connected across the terminals of PV module 102b ($PV_{n+1}$), and the other port connected across the line capacitor 110. Similarly, differential power processing converter 106c has one port connected across the terminals (upstream and downstream) of the line capacitor 110. The other port of differential power processing converter 106c is connected across the terminals of PV module 102c (module $PV_{n+1}$). It should be understood that the partial string comprises PV module 102b connected in series with line capacitor 110, which, in turn, is connected in series with PV module 102c. Most of the string current $I_{str}$ passes over the PV modules 102b, 102c, and the line capacitor 110, while a small portion of $I_{str}$ passes over DPPs 106b, 106c.

Figure 2:
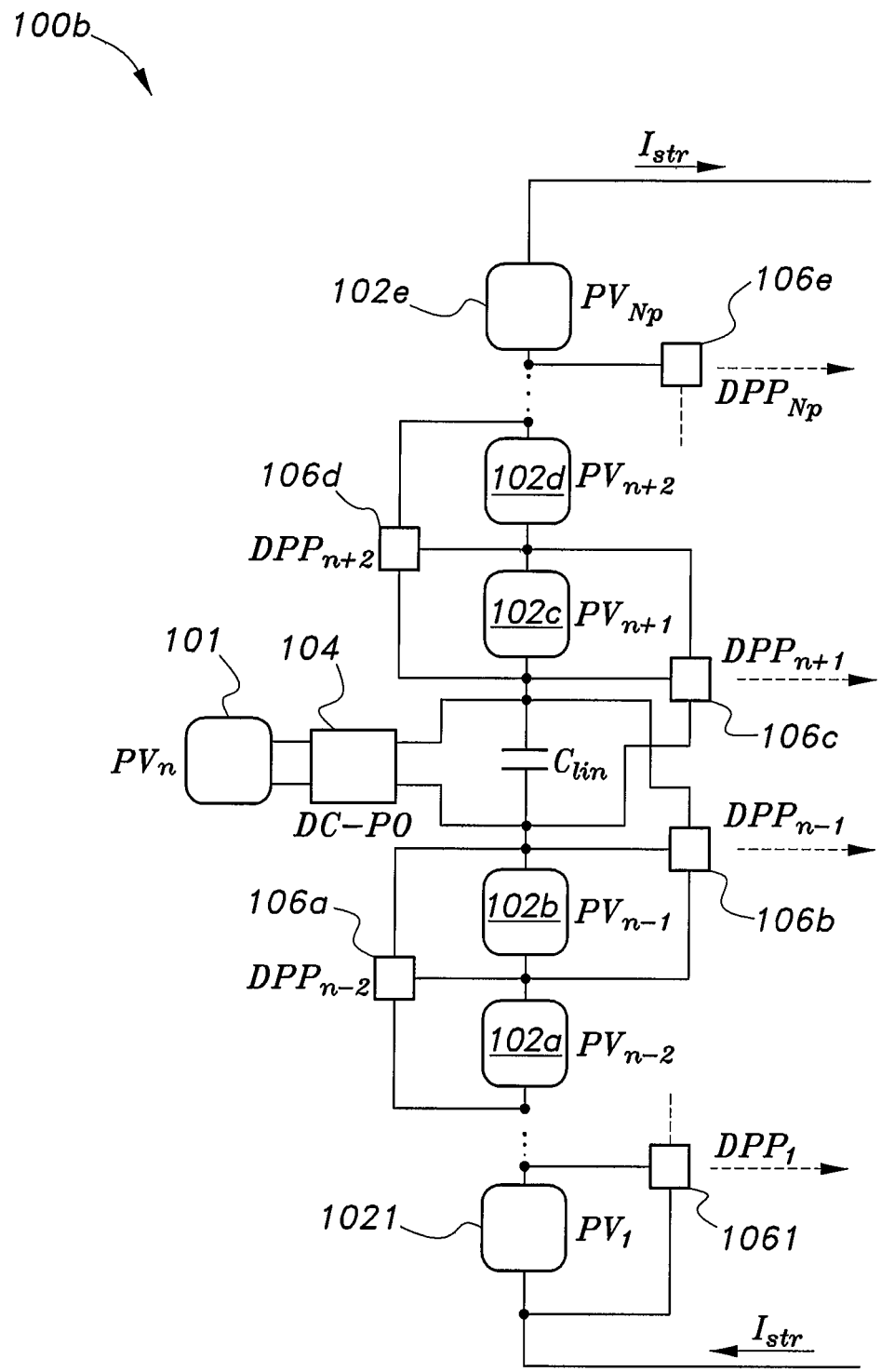
FIG. 2 is a schematic diagram of a generalized hybrid partial power processing system according to the present invention.
Figure 5A:
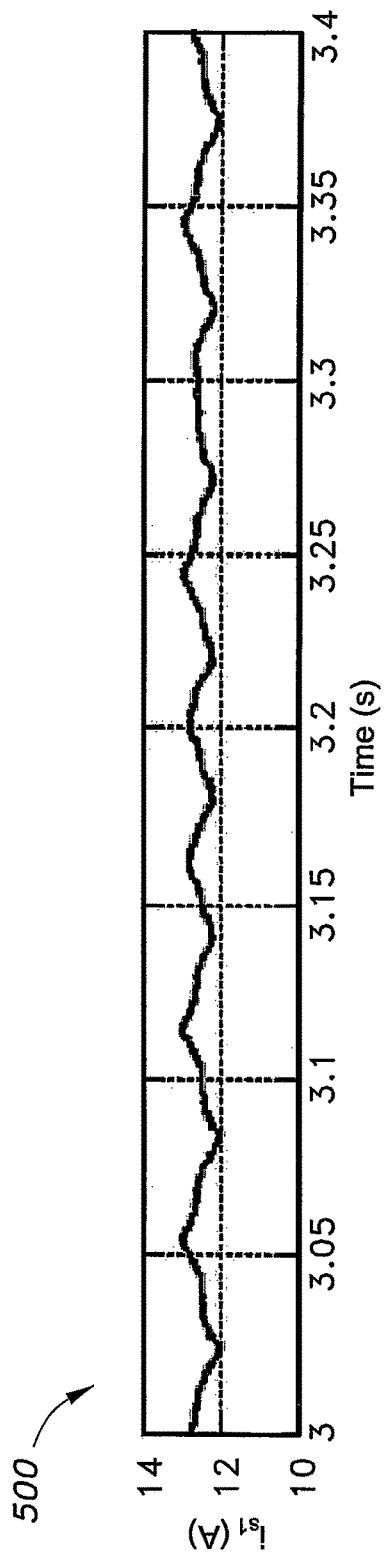
FIGS. 5A, 5B, 5C, 5D, and 5E are plots showing the output currents of first through fifth PV modules, respectively, in a simulation of a hybrid partial power processing system according to the present invention using a buck-type DC power optimizer (DC-PO).
Figure 5B:
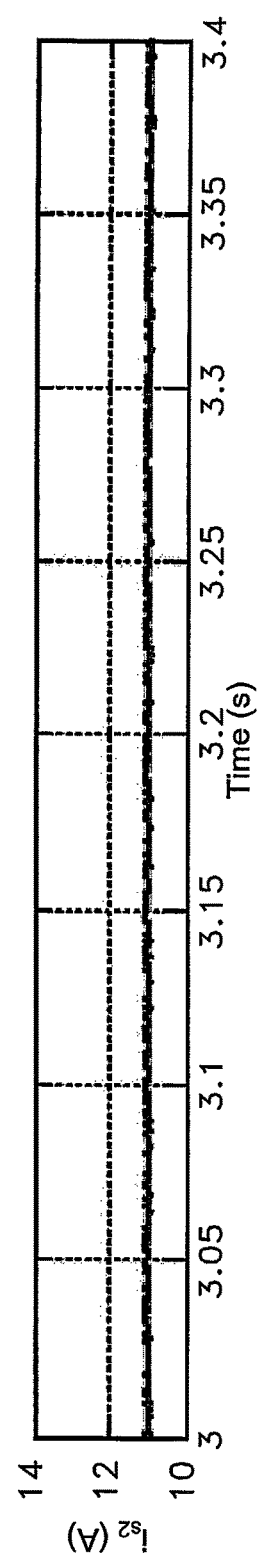
Figure 5C:
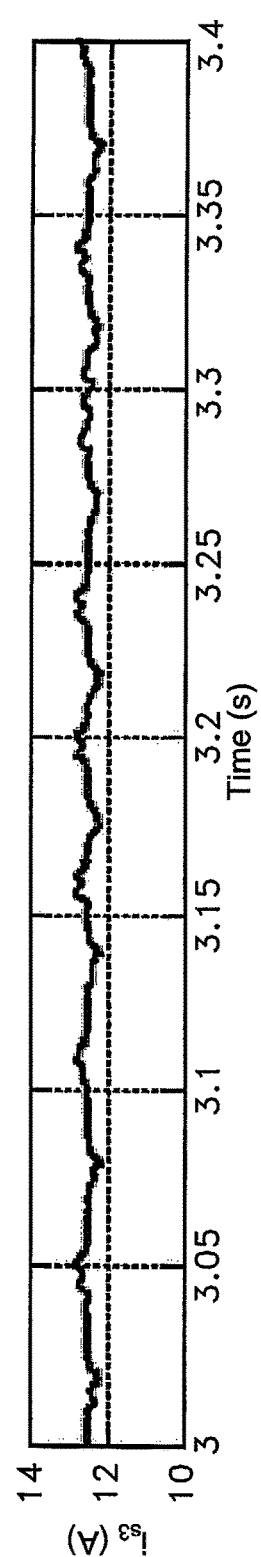
Figure 5D:
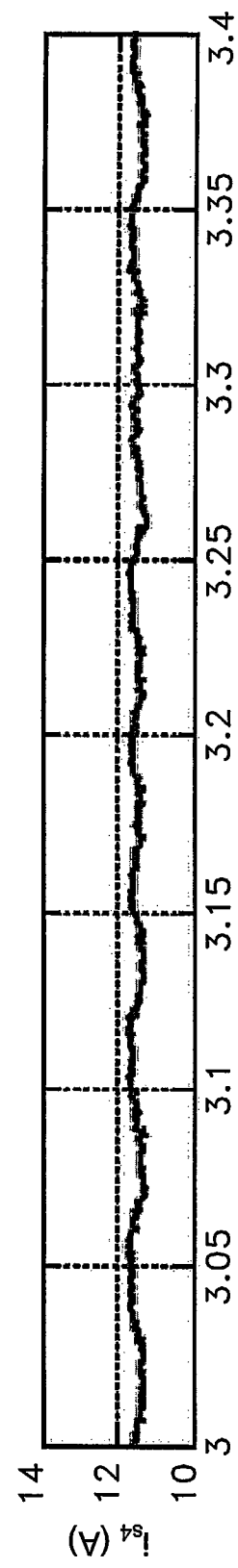
Figure 5E:
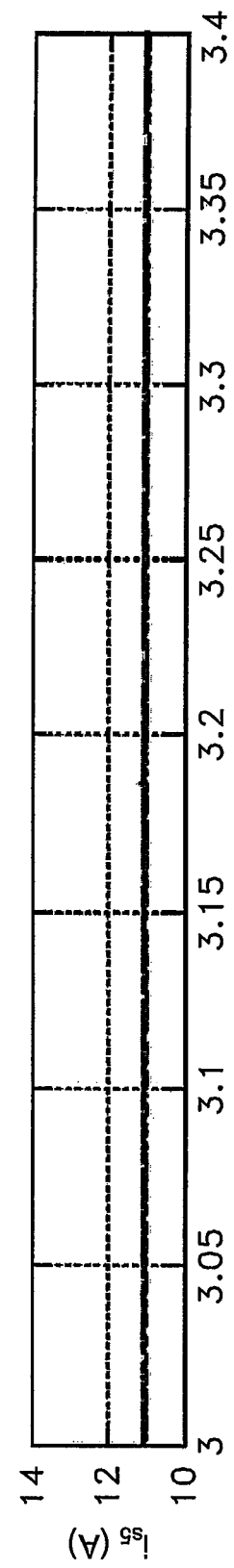

FIG. 2 shows the complete structure 100b of a PV string with the hybrid system for PPP (the PV modules 1021, 102a, 102b being connected in series and to the downstream side of the line capacitor $C_{lin}$, and the PV modules 102c, 102d, and 102e being connected in series and to the upstream side of line capacitor $C_{lin}$). The differential power processing converters 106b and 106c are connected to the string in the same manner as the DPP connections shown in FIG. 1, while each of the remaining differential power processing converters has PV modules connected in its two ports. E.g., the differential power processing converter 106a has the PV module 102a ($PV_{n-2}$) connected across one of its ports, while the other port is connected across the PV module 102b ($PV_{n-1}$). $DPP_1$ 1061, $DPP_{n-2}$ 106a, $DPP_{n-1}$ 106b, $DPP_{n+1}$ 106c, $DPP_{n+1}$ 106c and $DPP_{Np}$ 106e are shown to support bidirectional power flow, but unidirectional power flow operation could also be supported. The converter DC-PO 104 is a DC/DC converter used to feed current (power) from the module $PV_n$ 101 to $C_{lin}$.

Let the maximum power point (MPP) currents for $PV_{n-1}$, $PV_n$ and $PV_{n+1}$ in FIG. 1 be $I_{m,n-1}$, $I_{m,n}$ and $I_{m,n+1}$, respectively. In general, the current $I_{str}$ that flows in the string could be different from $I_{m,n-1}$, $I_{m,n}$ and $I_{m,n+1}$. Assume that:

$$I_{m,n-1} - I_{str} = \Delta I_{m,n-1} > 0 \quad (1)$$

In this case, the converter $DPP_{n-1}$ 106b can be driven such that the current $I_{i,n-1}$ shown in FIG. 1 becomes equal to $\Delta I_{m,n-1}$ in Equation (1). On the other hand, consider that:

$$I_{m,n+1} - I_{str} = \Delta I_{m,n+1} < 0 \quad (2)$$

The converter $DPP_{n+1}$ 106c is then driven to track the MPP of $PV_{n+1}$, which makes $I_{i,n+1} = -\Delta I_{m,n+1}$. The converters $DPP_{n-1}$ 106b and $DPP_{n+1}$ 106c process the currents $I_{i,n-1}$ and $I_{i,n+1}$, respectively, and supply/draw appropriate currents to/from the capacitor $C_{lin}$, whose values maintain balance between the converter input and output power. The output current of the converter DC-PO is driven independently to track the MPP of the module $PV_n$. The gain of the converter DC-PO is automatically adjusted such that the sum of all currents of $DPP_{n-1}$, $DPP_n$, $DPP_{n+1}$ and DC-PO that flow to/from $C_{lin}$ becomes equal to the string current $I_{str}$. The MPP of each PV is tracked independently by a separate DC/DC converter. Accordingly, fast maximum power point tracking (MPPT) of the individual PV modules could be achieved using only one DC-PO and low cost DPPs. DPPs have low cost and low losses, as they process only a fraction of the power produced by PV modules. Clearly, the MPPT could be achieved all the time, since whenever there is an increase in the PV power, the voltage across $C_{lin}$ will increase, and whenever there is a reduction in the PV power, a drop will occur in this voltage. The DC-PO always adjusts its duty ratio to track the MPP of $PV_n$ based on the voltage of $C_{lin}$. Accordingly, low cost, high efficiency, modularity, simple control, simple structure, and fast MPPT could all be achieved in this system.

In one embodiment, the module $PV_n$ and its DC-PO could be replaced with a DC/DC converter that feeds power from the two terminals of the entire string to the line capacitor. In another embodiment, a power source other than PV module could be used to replace $PV_n$ in the input port of DC-PO.

In some embodiments, the hybrid PPP shown in FIG. 1 could be used to process the power in sub-modules within the same PV module. In other embodiment, more than one PV module could be connected in parallel or series across the same port of a DPP.

The converters DC-PO, $DPP_{n-1}$ and $DPP_{n+1}$ could be non-isolated or isolated converters. Moreover, $DPP_{n-1}$ and $DPP_{n+1}$ can be bidirectional, as well as unidirectional. The converters DC-PO, $DPP_{n-1}$ and $DPP_{n+1}$ can be buck, boost, buck-boost, resonant converters, and variations of these topologies in isolated and non-isolated forms.

A generalized example of a PPP system is shown in FIG. 2. The string in FIG. 2 has a number $N_P$ of PV modules connected in series. The modules $PV_1$, $PV_2$, ... $PV_{n-1}$ are connected in the lower part of the string below $C_{lin}$, while the modules $PV_{n+1}$, $PV_{n+2}$, ... $PV_{N_p}$ are connected in the upper part above $C_{lin}$. In this example, the number of PV modules connected below $C_{lin}$ is equal to the number of PV modules connected above it. However, in general, these two numbers could be different, and it is also possible to have one of the two numbers as zero.

The MPP of module $PV_x$ is tracked by driving the converter $DPP_x$, $x=1, 2, \ldots n-1, n+1, N_p$. $DPP_x$ measures the current/voltage of $PV_x$ and supplies/draws current from the PV module or $C_{lin}$ connected to its other port such that the MPP of the module $PV_x$ is tracked. The number of DPPs is equal to the number of modules, excluding the one that is driven by DC-PO. Therefore, local control for $DPP_x$ can be applied using only local measurements of voltages and currents in its two ports by a microcontroller in the $DPP_x$ circuit to track the MPP of $PV_x$. It is clear that merely local control is needed for driving DPPs and DC-PO, which simplifies the system operation significantly and makes the system modular and easily scalable.

Two simulation studies were conducted to verify the effectiveness of the present method for PPP. In both studies, a string composed of five PV modules is considered. In the first simulation, the present system with buck-boost type DC-PO was tested, while in the second, a buck DC-PO was investigated, while the DPPs in both simulations are taken as buck-boost DC/DC converters. Bidirectional DPPs are used in the first simulation, and Table 1 shows the parameters of that simulation. From the table, it is clear that the PV modules have different MPP currents.

TABLE 1

Parameters of PPP Simulated System with Buck-Boost DC-PO

| | |
|---|---|
| $I_{m,1}$ | 12.5 A |
| $I_{m,2}$ | 12.0 A |
| $I_{m,3}$ | 12.0 A |
| $I_{m,4}$ | 11.5 A |
| $I_{m,5}$ | 11.0 A |
| DPP Inductor | 600 µH |
| $C_{lin}$ | 2 mF |

The output currents of the five modules are shown in plot series 300 of FIGS. 3A through 3E. All PV modules maintained MPP operating throughout the system operation. Positive duty ratio represents supplying power from the PV module toward the direction of $C_{lin}$ while negative duty ratios represent the case of absorbing current for the direction of $C_{lin}$. Since $PV_1$ and $PV_2$ have high MPP currents, they could achieve MPP operation by supplying extra currents toward the direction $C_{lin}$, while $PV_4$ and $PV_5$ needed to consume current from the direction of $C_{lin}$, and the values of their duty ratios, shown in plot series 400 of FIGS. 4A through 4E, reflect these facts. These drawings show clearly fast MPPT through a simple and modular control system.

In the second simulation, a buck-type DC-PO was used, while the DPPs were of unidirectional type. The parameters of the simulation are listed in Table 2. Since all DPPs need to absorb currents from the $C_{lin}$ direction in the buck DC-PO simulation, their duty ratios must always be negative.

TABLE 2

Parameters of PPP simulated system with buck DC-PO

| | |
|---|---|
| $I_{m,1}$ | 12.5 A |
| $I_{m,2}$ | 11.0 A |
| $I_{m,3}$ | 12.5 A |
| $I_{m,4}$ | 11.5 A |
| $I_{m,5}$ | 11.0 A |
| DPP Inductor | 600 μH |
| $C_{lin}$ | 2 mF |

Plot series 500 of FIGS. 5A through 5E show the output currents of the PV modules where they match the required values of the MPP currents listed in Table 2. The duty ratios are always negative, and they are adjusted to track the MPP of the various PV modules, as shown in plot series 600 of FIGS. 6A through 6E.

It is to be understood that the present invention is not limited to the embodiments described above, but encompasses any and all embodiments within the scope of the following claims.

We claim:

1. A hybrid partial power processing system, comprising:
   a DC power optimizing converter (DC-PO) having an input and an output, the output of the DC-PO having a first output terminal and a second output terminal;
   a photovoltaic (PV) module connected to the input of the DC-PO;
   a line capacitor $C_{lin}$ having a downstream side and an upstream side, the downstream side being connected to the first output terminal of the DC-PO, the upstream side being connected to the second output terminal of the DC-PO;
   at least one downstream PV module connected in a serial string to the downstream side of the line capacitor $C_{lin}$;
   at least one upstream PV module connected in a serial string to the upstream side of the line capacitor $C_{lin}$; and
   for each of the at least one downstream PV modules and for each of the at least one upstream PV modules, a corresponding differential power processing converter (DPP) having two differential leads connected in parallel across the corresponding downstream or upstream PV module and a third lead connected to a neighboring downstream or upstream PV module or the line capacitor $C_{lin}$;
   wherein the hybrid partial power processing system is configured to allow exchange of differential power between two adjacent PV modules or between a PV module and the line capacitor $C_{lin}$, thereby aiding speed of maximum power point tracking (MPPT) of the hybrid partial power processing system.

2. The hybrid partial power processing system according to claim 1, wherein each of the DPP is selected from a group consisting of a bidirectional DPP and a unidirectional DPP.

3. The hybrid partial power processing system according to claim 1, wherein said DC power optimizing converter (DC-PO) comprises a plurality of DC-POs connected across the line capacitor $C_{lin}$.

4. The hybrid partial power processing system according to claim 1, wherein the DPPs and said DC-PO are selected from a group consisting of isolated converters or non-isolated converters.

5. The hybrid partial power processing system according to claim 1, wherein the DPPs and said DC-PO comprise converters selected from a group consisting of buck DC/DC converters, boost DC/DC converters, buck-boost DC/DC converters, and resonant DC/DC converters.

6. The hybrid partial power processing system according to claim 1, wherein the two differential leads of said corresponding differential power processing converter (DPP) are connected across a plurality of the PV modules.

7. The hybrid partial power processing system according to claim 1, further comprising at least one power exchanging DC-DC converter connected in parallel with said DC-PO.

8. The hybrid partial power processing system according to claim 1, wherein said corresponding differential power processing converter (DPP) includes a microcontroller using only local measurements of voltages and currents in said DPPs two ports to track a maximum power point (MPP) of the corresponding PV module for local control of the MPPT.

* * * * *